(12) United States Patent
Lee et al.

(10) Patent No.: US 6,469,258 B1
(45) Date of Patent: Oct. 22, 2002

(54) CIRCUIT BOARD FOR SEMICONDUCTOR PACKAGE

(75) Inventors: Choon Heung Lee, Seoul (KR); Won Dai Shin, Seoul (KR); Chang Hoon Ko, Kyungki-do (KR); Won Sun Shin, Kyungki-do (KR); Seon Goo Lee, Kyonggi-do (KR); Won Kyun Lee, Seoul (KR); Tae Hoan Jang, Seoul (KR); Jun Young Yang, Seoul (KR)

(73) Assignees: Amkor Technology, Inc., Chandler, AZ (US); Amkor Technology Korea, Inc., Seoul (KR)

( * ) Notice: Subject to any disclaimer, the term of this patent is extended or adjusted under 35 U.S.C. 154(b) by 0 days.

(21) Appl. No.: 09/648,946

(22) Filed: Aug. 23, 2000

(30) Foreign Application Priority Data

| Aug. 24, 1999 | (KR) | 99-35110 |
| Aug. 24, 1999 | (KR) | 99-35112 |
| Sep. 7, 1999 | (KR) | 99-37927 |
| Sep. 10, 1999 | (KR) | 99-38571 |
| Sep. 10, 1999 | (KR) | 99-38572 |
| Oct. 9, 1999 | (KR) | 99-43600 |

(51) Int. Cl.[7] .................... H01R 12/04; H05K 1/11
(52) U.S. Cl. ......................... 174/261; 174/260
(58) Field of Search ..................... 174/260–266; 361/777–779, 783

(56) References Cited

U.S. PATENT DOCUMENTS

| 5,474,958 A | 12/1995 | Djennas et al. ............ 437/211 |
| 5,620,928 A | 4/1997 | Lee et al. .................... 438/118 |
| 5,646,828 A | 7/1997 | Degani et al. .............. 361/715 |
| 5,835,355 A | 11/1998 | Dordi ......................... 361/760 |
| 5,866,949 A | 2/1999 | Schueller .................... 257/778 |
| 5,903,052 A | 5/1999 | Chen et al. .................. 257/706 |
| 6,034,427 A | 3/2000 | Lan et al. .................... 257/698 |
| 6,060,778 A | 5/2000 | Jeong et al. ................. 257/710 |
| 6,100,804 A | 8/2000 | Brady et al. ............. 340/572.7 |
| 6,107,689 A | 8/2000 | Kozono ....................... 257/778 |
| 6,127,833 A | 10/2000 | Wu et al. .................... 324/755 |
| 6,160,705 A | 12/2000 | Stearns et al. .............. 361/704 |
| 6,172,419 B1 | 1/2001 | Kinsman .................... 257/737 |
| 6,246,015 B1 * | 6/2001 | Kim ............................ 174/261 |

* cited by examiner

*Primary Examiner*—Kamand Caneo
*Assistant Examiner*—Jeremy Norris

(57) ABSTRACT

A circuit board for semiconductor package is designed to provide a complete grounding with corresponding equipment in the manufacture of the semiconductor package based on a circuit board, thereby preventing a breakdown of the circuit board or semiconductor chip caused by electrostatic charges. The printed circuit board for semiconductor package includes: a resinous substrate; a chip mounting region formed on the top surface of the resinous substrate for mounting a semiconductor chip thereon; a plurality of fine circuit patterns radially disposed in the circumference of the chip mounting region and extending to the edge of the chip mounting region; a plurality of ball lands formed in an array on the bottom surface of the resinous substrate, to be fused to conductive balls; a conductive via hole connecting the circuit patterns on the top surface of the resinous substrate to the ball lands on the bottom surface of the resinous substrate; a cover coat applied to the top and bottom surfaces of the resinous substrate to protect the circuit patterns from an external environment and make the ball lands open to the exterior; and a means for removing electrostatic charges provided at the edge of the substrate and connected to the plural circuit patterns to remove electrostatic charges in the manufacture of semiconductors.

44 Claims, 13 Drawing Sheets

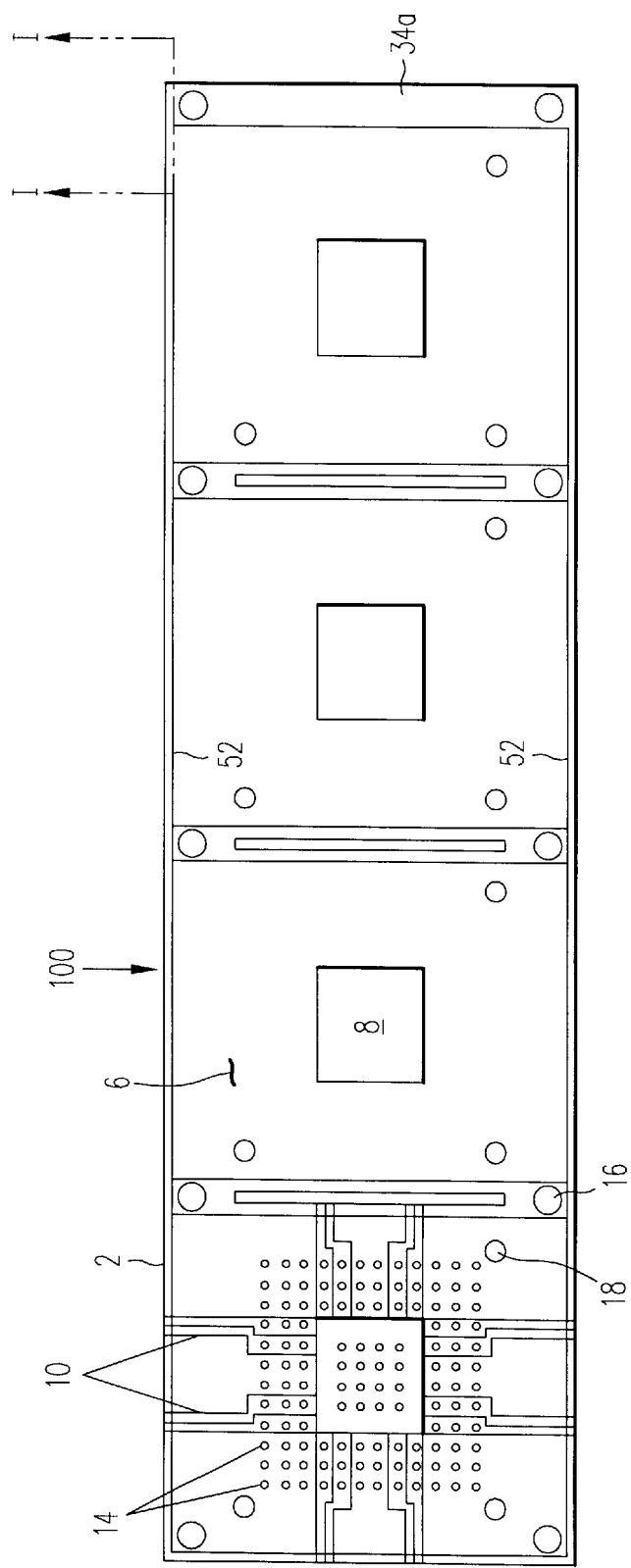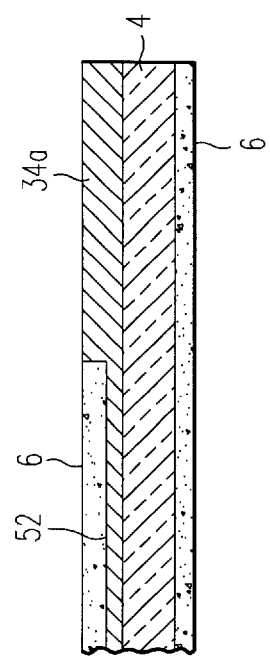
FIG. 5A
FIG. 5B

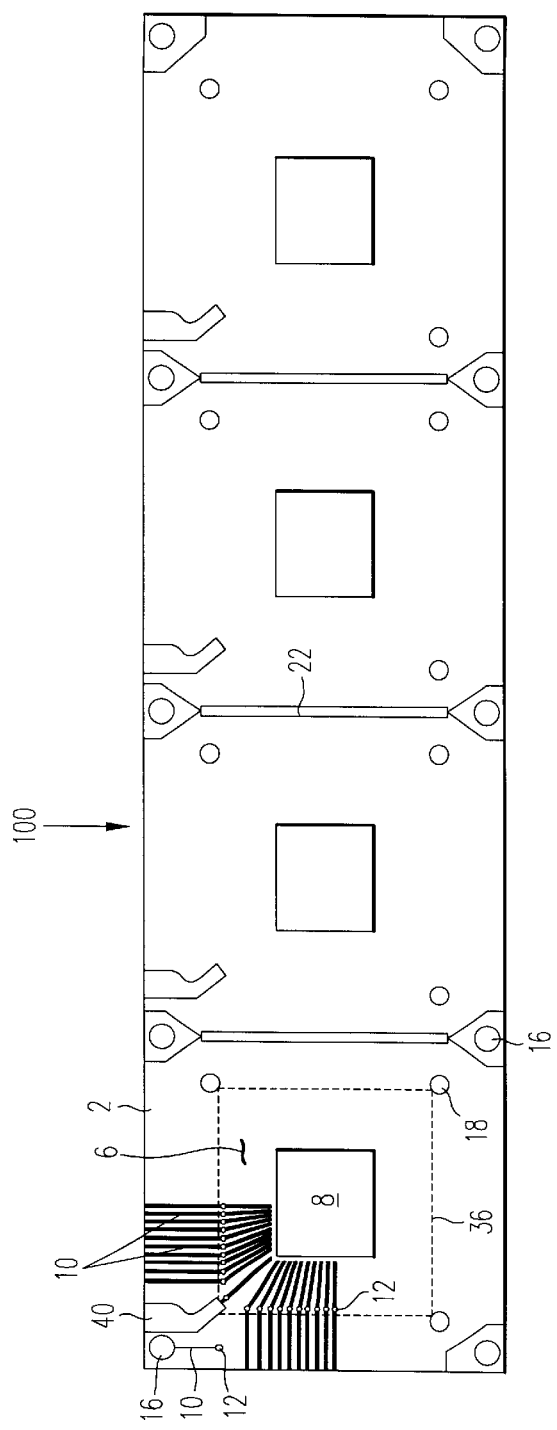
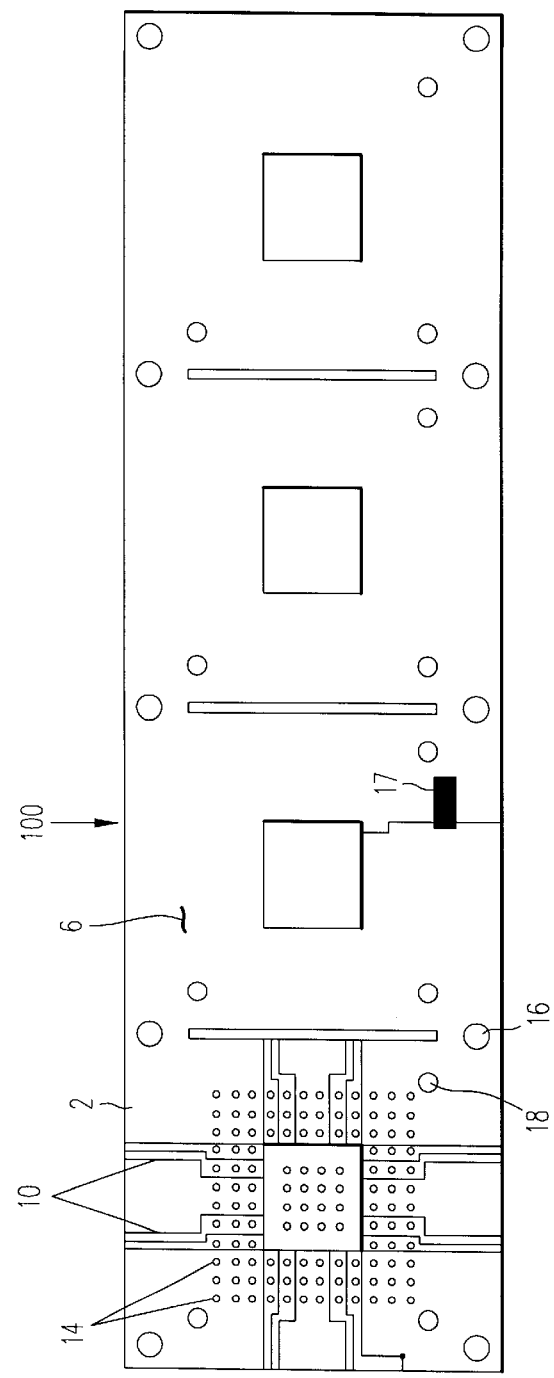
FIG. 9A
FIG. 9B

CIRCUIT BOARD FOR SEMICONDUCTOR PACKAGE

BACKGROUND OF THE INVENTION

1. Field of the Invention

The present invention relates to a circuit board for a semiconductor a package and, more particularly, to a circuit board for semiconductor package having a structure that completely grounds corresponding equipment used in the manufacture of semiconductor packages based on the circuit board, thereby preventing a breakdown of the semiconductor chip or circuit board due to electrostatic discharge ("ESD").

2. Description of the Related Art

Generally, a circuit board for semiconductor package fixedly supports a semiconductor chip mounted on a main board, and intermediates required electrical signals between the semiconductor chip and the main board. During manufacturing of the package, a plurality of circuit board units are joined in one strip, and the packages are made in parallel. The individual circuit board units usually include an insulative thermosetting resin substrate or film coated with a copper circuit pattern on both sides thereof. Portions of the circuit pattern are coated with a cover coat on both sides.

Recently developed semiconductor chips operate with a low driving voltage and small acceptable voltage error. Unfortunately, such semiconductor chips or circuit boards upon which the chips are mounted are susceptible to a breakdown due to electrostatic charges accumulated and discharged during the process for assembling the semiconductor package, e.g., during wire bonding, molding, marking, ball bumping and singulation.

For example, during the encapsulation step, there may be direct friction between a polymer-based encapsulating material and a cover coat or conductive layer of the circuit board (e.g., signaling, grounding and powering circuit patterns) or the semiconductor chip, resulting in electrostatic charges being accumulated on the circuit board or semiconductor chip. The circuit board with accumulated electrostatic charges is then taken off from a mold for the subsequent step, during which procedure the conductive parts of the circuit board get in contact with the mold or another conductive material, which causes an abrupt discharge of the electrostatic charges, thereby damaging the semiconductor chip or circuit board. Such a large discharge of electrostatic charges may occur in all steps of the process, but more frequently occurs during the encapsulation step of the circuit board when using a mold.

To solve this problem, referring to FIGS. 9A and 9B, a method has been suggested to provide separately coated index holes 16 (FIG. 9A) or a ground plate 17 (FIG. 9B) in circuit board unit 2 or strip 100. Expediently, it is illustrated in the figures that the coated index hole and the ground plate are provided on a single circuit board strip.

In FIG. 9A, on a resinous substrate is formed an approximately square chip mounting region 8 to mount a semiconductor chip on, with close and fine conductive circuit patterns 10 radially arranged in the periphery of the chip mounting region 8. Between the circuit patterns 10 is provided a gold gate 40 connected to the chip mounting region 8 or the circuit pattern 10, especially, grounding pattern and providing a passage for the encapsulating material flowing from the edge of the respective circuit board units 2 towards the chip mounting region 8. The chip mounting region 8 and the circuit patterns 10 on the resinous substrate are coated with a cover coat 6, while the end portions of the circuit patterns 10 electrically connected to the gold gate 40 and the semiconductor chip are open to the exterior without cover coat 6. A defined portion of the circuit patterns 10 has a conductive via hole 12 downwardly formed in the resinous substrate (in the drawing, the via holes 12 are formed just inside dash line 36), and a plurality of ball lands 14 (to be fused to conductive balls) are connected to the via hole 12 on the underneath of the resinous substrate. The overall bottom surface of the resinous substrate other than ball lands 14 is also coated with the cover coat 6.

In FIGS. 9A and 9B, reference numeral 22 denotes a slot having a desired length formed between the respective circuit board units 2, reference numeral 18 denotes a singulation hole used as a baseline of the circuit board strip 100 cut into semiconductor packages, reference numeral 16 denotes an index hole used to fix or load the circuit board on various equipment, and dash line 36 denotes the perimeter of an encapsulation region.

The index hole 16, which has its inner wall coated with metal, is connected to a grounding circuit pattern 10. Also, the individual index hole 16 receives a fixed pin provided on equipment every time the circuit board is set in the equipment, so that the metallic equipment gets in electrical contact with the index hole 16 of the circuit board, causing the electrostatic charges to move from the circuit board or semiconductor chip to the equipment.

However, as the index hole 16 is slightly larger in diameter than the fixed pin of the equipment, and taking the fixed pin out of the index hole 16 in an intended manner or not makes the grounding status unstable temporarily, with the potential of discharging a large amount of charges.

On the other hand, as shown in FIG. 9B, a ground plate 17 having a desired area is formed in the individual units 2 containing a plurality of ball lands 14 as well as the coated index hole 16. When loading the circuit board on the corresponding equipment, the ground plate 17 gets in ground contact with a conveying rail or a loading portion of the equipment. The ground plate 17 is of course connected to the grounding circuit pattern. However, there are some worse cases where warpage of the circuit board strip renders the grounding status unstable between the ground plate 17 and the equipment, resulting in a breakdown of the circuit board of semiconductor package.

SUMMARY OF THE INVENTION

An object of the present invention to solve the problems with the prior art is to provide a circuit board for semiconductor package capable of easily moving electrostatic charges generated during an encapsulation step from the circuit board or semiconductor chip to a mold.

Another object of the present invention is to provide a circuit board for semiconductor package designed to provide a complete grounding with corresponding equipment in the manufacture of the semiconductor package based on a circuit board, thereby preventing a breakdown of the circuit board or semiconductor chip caused by electrostatic charges.

To achieve the above objects and others, there is provided a printed circuit board for semiconductor package including: a resinous substrate; a chip mounting region formed on the top surface of the resinous substrate for mounting a semiconductor chip thereon; a plurality of fine circuit patterns radially disposed in the circumference of the chip mounting region and extending to the edge of the chip mounting region; a plurality of ball lands formed in an array on the bottom surface of the resinous substrate, to be fused to conductive balls; a conductive via hole connecting the circuit patterns on the top surface of the resinous substrate to the ball lands on the bottom surface of the resinous substrate; a cover coat applied to the top and bottom surfaces of the resinous substrate to protect the circuit patterns from an external environment and make the ball lands open to the exterior; and a means for removing electrostatic charges provided at the edge of the substrate and connected to the plural circuit patterns to remove electrostatic charges in the manufacture of semiconductors.

In another aspect of the present invention, the circuit board may have a matrix form, in which a plurality of the circuit boards are connected in series with a slot interposed therebetween to constitute a strip, and a plurality of the chip mounting regions are separated at a defined distance from one another and collectively arranged in rows and columns to constitute one sub strip, wherein a plurality of the sub strips are connected with a boundary of a slot having a defined length to constitute one main strip.

The electrostatic charge removing means includes an opening region not coated with the cover coat so as to expose the circuit patterns to the exterior in the vicinity of the edge of the circuit board to be in close contact with a mold in an encapsulation step.

The electrostatic charge removing means includes a ground metal line having a defined width formed along one edge of the circuit board with the ball lands formed thereon to be in contact with corresponding equipment in a manufacture of the semiconductor package.

In the strip type circuit board, the electrostatic charge removing means includes a common pattern formed along the edge of the individual units on either side of the circuit board, the common patterns of the individual units being interconnected, one of the plural units having a grounding means connected to the common pattern, the grounding means being open by the cover coat.

The matrix type circuit board further comprises: a plurality of ground rings formed in the circumference of the plural chip mounting regions on the bottom surface of the resinous substrate of the individual sub strip; a means for electrically connecting one ground ring to the adjacent ground rings; and a conductive pad electrically connected to the ground rings and disposed at the edge of the resinous substrate in order to prevent accumulation of electrostatic charges in a manufacture of the semiconductor package.

Furthermore, the electrostatic charge removing means includes a printed circuit board labeling region having a conductive pad, the printed circuit board labeling region being marked in a character or symbol.

In the present invention, the electrostatic charge removing means is formed with a plurality of interconnected circuit patterns extending from the vicinity of the edge of the unit, strip or matrix type circuit board to the edge of the circuit board, causing the circuit board to be grounded to the corresponding equipment completely in the manufacture of the semiconductor package and thereby preventing a breakdown of the semiconductor chip or circuit board occurring due to static electricity. As described above, the electrostatic charge removing means includes a common pattern coated with the cover coat, as well as the opening region or the metal line not coated with the cover coat. The electrostatic charge removing means further includes a conductive pad completely grounded in contact with the manufacturing equipment in the manufacture of the semiconductor package.

BRIEF DESCRIPTION OF THE DRAWINGS

FIGS. 5A, 5B, 6A and 6B are bottom and cross-sectional views of a circuit board for semiconductor package in accordance with a third embodiment of the present invention;

FIGS. 9A and 9B are plan and bottom views of a circuit board for semiconductor package according to prior art, respectively.

DETAILED DESCRIPTION OF THE EXEMPLARY EMBODIMENTS

This application claims priority to the patent applications listed in Table 1, which were filed in Korea. All of the Korean applications of Table 1 are incorporated herein by reference in their entireties. Certified copies of the applications were filed simultaneously with the present application.

TABLE 1

| Prior Foreign Application(s) | | |
|---|---|---|
| Number | Country | Month/Day/Year Filed |
| 99-35110 | Korea | August 24, 1999 |
| 99-35112 | Korea | August 24, 1999 |
| 99-37927 | Korea | September 7, 1999 |
| 99-38571 | Korea | September 10, 1999 |
| 99-38572 | Korea | September 10, 1999 |
| 99-43600 | Korea | October 9, 1999 |

Hereinafter, the present invention will be described in detail with reference to the accompanying drawings.

Figure 1A:
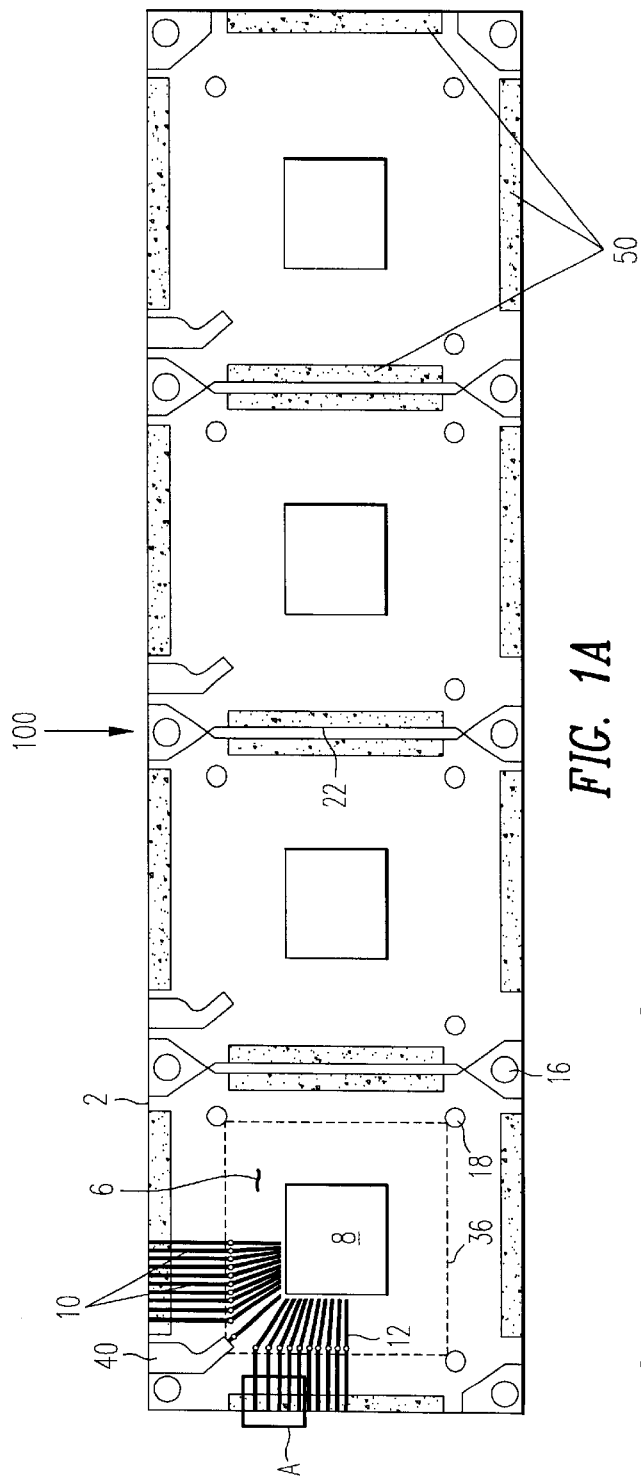
FIG. 1A is a plan view of a circuit board for semiconductor package in accordance with a first embodiment of the present invention.
Figure 1C:
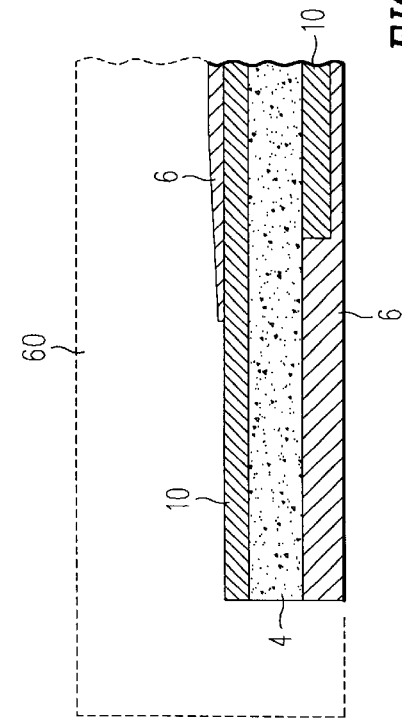
FIG. 1C is a cross-sectional view taken along the line I—I of FIG. 1B.
Figure 1B:
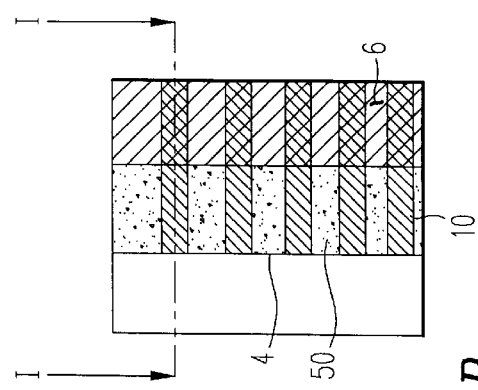
FIG. 1B is an enlarged view of part A shown in FIG. 1A.

FIG. 1A is a plan view of a circuit board for semiconductor package in accordance with a first embodiment of the present invention, FIG. 1B is an enlarged view of part A shown in FIG. 1A, and FIG. 1C is a cross-sectional view taken along the line I—I of FIG. 1B;

A circuit board strip 100 according to the first embodiment of the present invention is essentially analogous to the previously described circuit board strip shown in FIGS. 9A and 9B, with the exception that a cover coat 6 defines opening regions 50 for removing electrostatic charges. Circuit patterns 10 at the periphery of each circuit board unit 2 are exposed through opening regions 50. Opening regions 50 are superimposed over circuit patterns 10 at the outer edges of each circuit board unit 2 and in the vicinity of a slot 22 to be in close grounding contact with a mold 60 in the encapsulating step (FIG. 1C).

Figure 2A:
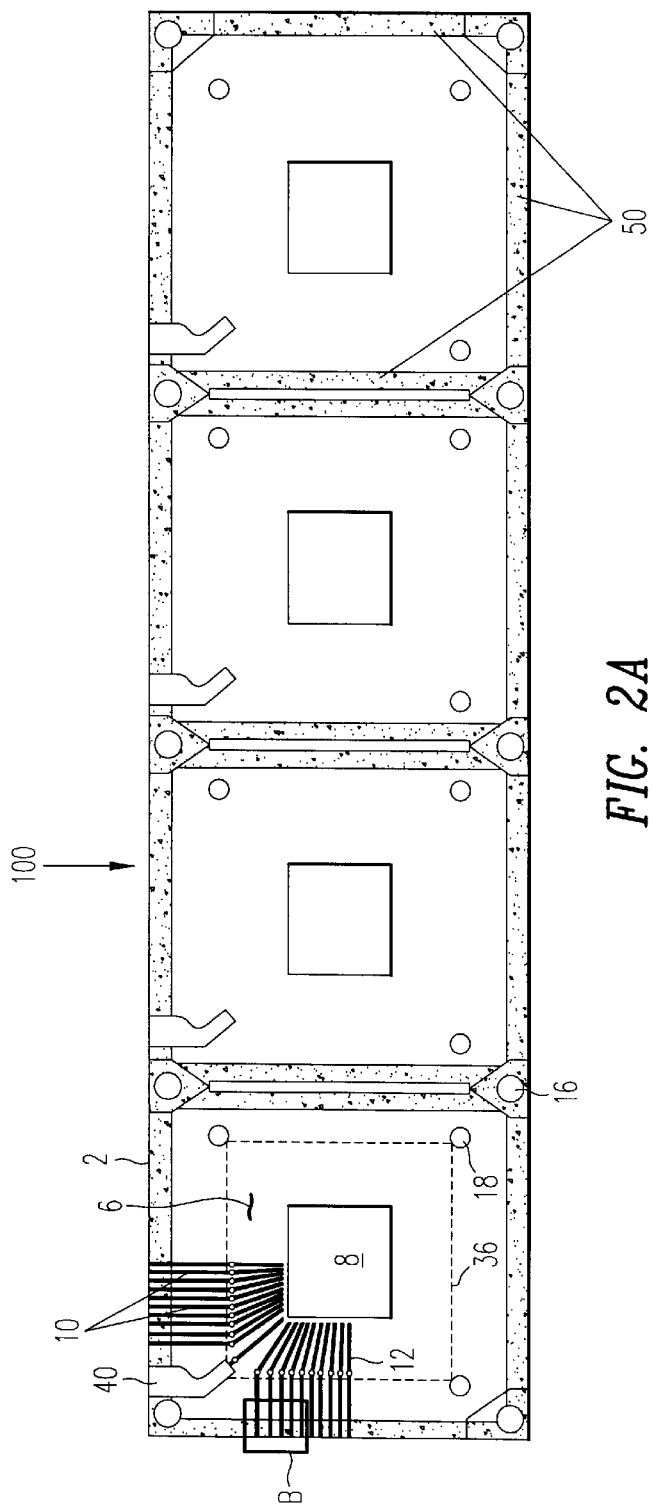
FIG. 2A is a plan view of another example of the circuit board for semiconductor package in accordance with the first embodiment of the present invention.
Figure 2B:
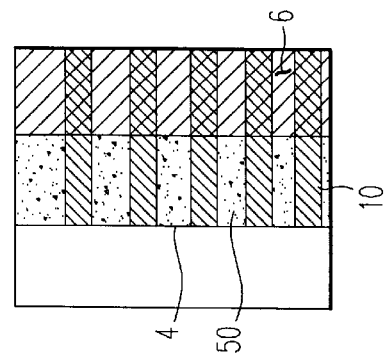
FIG. 2B is an enlarged view of part B shown in FIG. 2A.

That is, the opening regions 50 are provided in the rectangular form at the edge of the individual circuit board unit 2 and in the vicinity of the slot 22, as shown in FIGS. 1a and 1b, or in the form of an integrated square band along the edge of the circuit board unit 2 and the slot 22, as shown in FIGS. 2a and 2b.

The approximately rectangular opening regions 50 as shown in FIGS. 1a and 1b are formed outside an encapsulating region 36 and, in particular between index holes 16 most pressed by the mold 60, i.e., at the edge of the circuit board unit 2 and in the vicinity of the slot 22. The approximately square band type opening regions 50 as shown in FIGS. 2a and 2b are provided in an integral form between a singulation hole 18 and the index holes 16, i.e., along the edge of the circuit board unit 2 and the slot 22. Vias 12 are within encapsulation region 36, while circuit patterns 10 extend from adjacent chip mounting region 8 to the edges of circuit board unit 2.

The opening regions 50 provide a passage for a plurality of circuit patterns 10 extending towards the edge of the circuit board unit 2, such as signaling, grounding and powering circuit patterns, which are all exposed externally through the opening regions 50, and are not coated with the cover coat 6.

As shown in FIG. 1C, the cover coat 6 is made of a resilient polymer resin much thinner than a resinous substrate 4 and the circuit patterns 10 and, when pressed by the mold 60, has its thickness negligible. Thus, all circuit patterns 10 in the opening regions 50 not coated with the cover coat 6 are easily brought in direct contact with the mold 60.

Although this embodiment has been described in regard to the strip type circuit board for semiconductor package, the present invention can also be applied to a matrix type circuit board for semiconductor package in which a plurality of the chip mounting regions 8 are separated at a defined distance from one another and collectively arranged in rows and columns to constitute one sub strip, and a plurality of the sub strips are connected with a boundary of a slot having a defined length to constitute one main strip.

As such, the electrostatic charges generated due to direct friction between the encapsulating material and the circuit patterns 10 and the semiconductor chip during the encapsulation step is not accumulated on the semiconductor chip or circuit board, but immediately discharged to the mold 60 via the circuit patterns 10 in the opening regions 50. Here, the electrostatic charges accumulated in the semiconductor chip are also immediately discharged to the mold 60 via the circuit patterns 10 in the opening regions 50, because the semiconductor chip is electrically connected to the circuit patterns 10 via a conductive wire.

Figure 3:
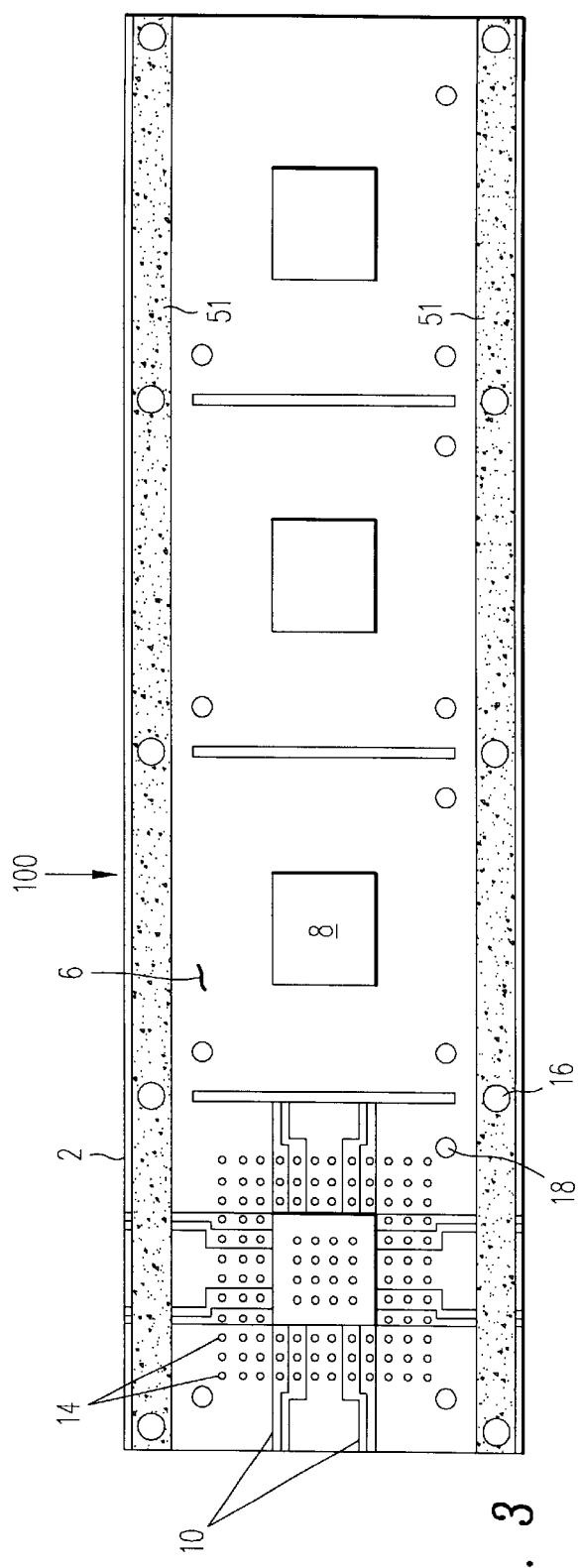
FIGS. 3 and 4 are bottom views of the circuit board for semiconductor package in accordance with a second embodiment of the present invention.

FIG. 3 is a bottom view of the circuit board for semiconductor package in accordance with a second embodiment of the present invention.

It is to be noted that the top structure of the circuit board according to the present invention is similar to that of the conventional circuit board and its detailed description will be avoided lest it should obscure the subject matter of the present invention.

The circuit board comprises a plurality of units 2 connected in series with a long vertical slot 22 interposed therebetween, to constitute one strip 100, in which the individual unit 2 has a plurality of singulation holes 18 outside the ball land region 14, and metal lined index holes 16 are disposed in the vicinity of the upper or lower ends of the slot 22 so that fixed pins (not shown) on the corresponding equipment are inserted into the index holes 16 in holding or loading the circuit board strip 100.

As illustrated, the bottom structure of the circuit board according to the present invention has an array of ball lands 14, to be fused to conductive balls, on the surface of a resinous substrate (not shown). The entire surface of the resinous substrate other than the ball lands 14 is coated with a cover coat 6.

Additionally, the circuit board strip 100 has a ground metal line 51 having a defined width, which is used as a electrostatic charge remover connecting a plurality of circuit patterns 10 along the edge of the circuit board strip 100 to be brought in contact with the conveying rail or mounting region of the equipment in the manufacturing process of the semiconductor package. The ground metal line 51 may be provided, if not limited to, on either edge of the circuit board strip 100, or provided on both edges of the circuit board strip 100 in the form of a rail, as shown in FIG. 3.

In one embodiment, the ground metal line 51 consists of the same material of the circuit patterns 10 such as a copper film and, if necessary, has its thickness increased through application of at least one copper coating or a separate sputtering. If not specifically limited, the ground metal line 51 may have a thickness equal to or larger than that of the cover coat 6. Even when the ground metal line 51 is thin relative to the cover coat 6, the thickness of the cover coat 6 is negligible and the pressure imposed by the equipment or the own weight of the equipment makes the ground metal line 51 easily grounded to the equipment.

The ground metal line 51 also has the metal lined index holes 16, which is conductive together with the ground metal line 51. The index holes 16 are coated in connection with the grounding circuit pattern 10, so that all grounding signals are connected to the ground metal line 51 and the electrostatic charges flows towards the ground metal line 51.

As the ground metal line 51 provides a passage for all circuit patterns 10 including grounding, signaling and powering circuit patterns, the electrostatic charges can move to the ground metal line 51 via the signaling and powering circuit patterns 10 connected to the semiconductor chip, as well as the grounding circuit pattern 10.

Figure 4:
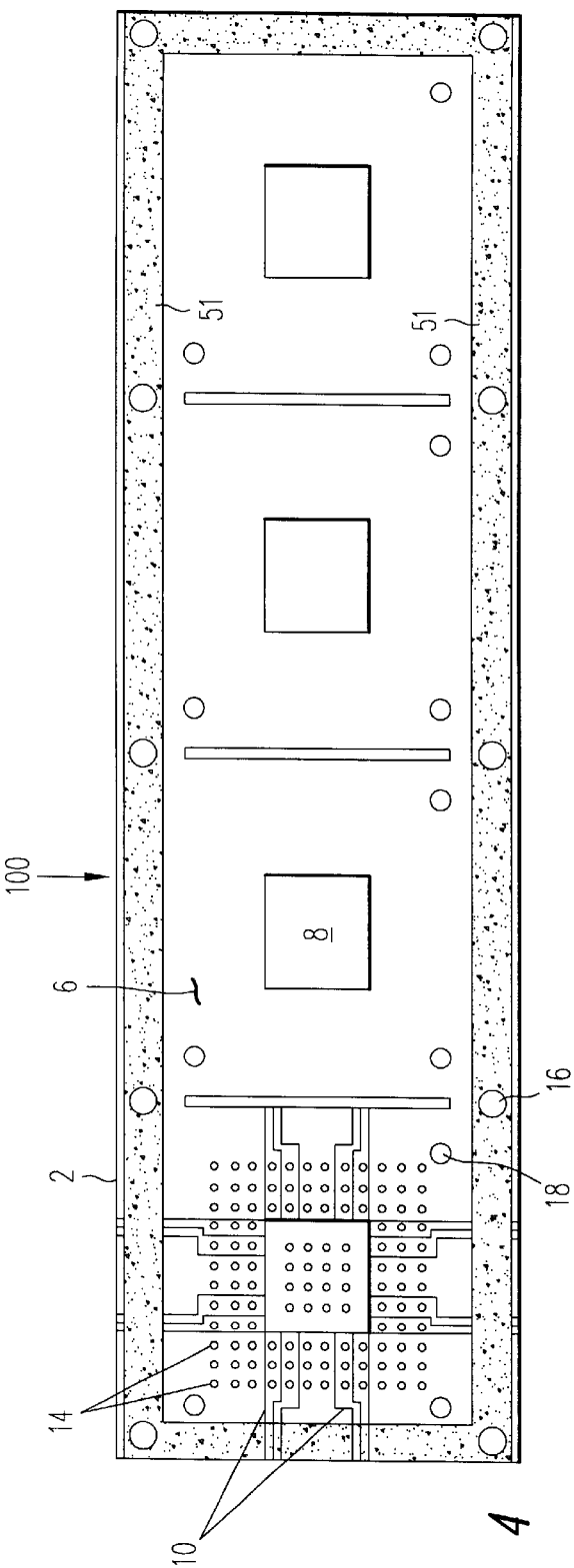
Figure 6A:
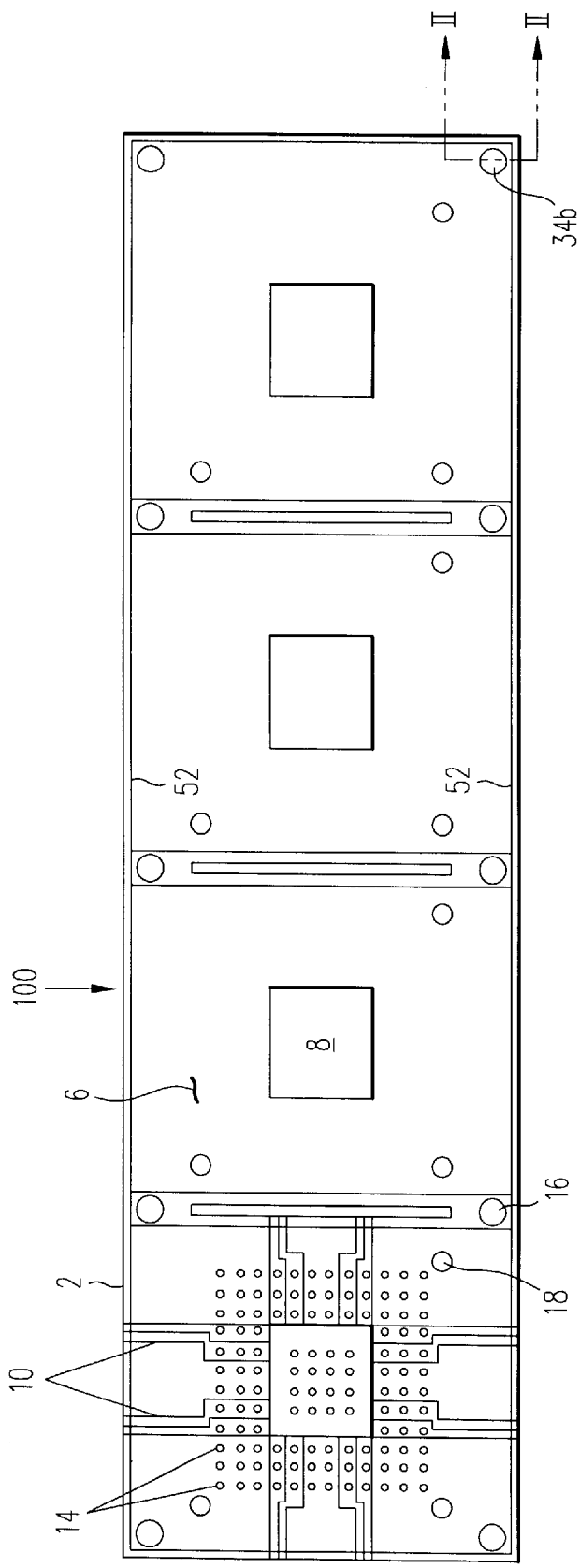
Figure 6B:
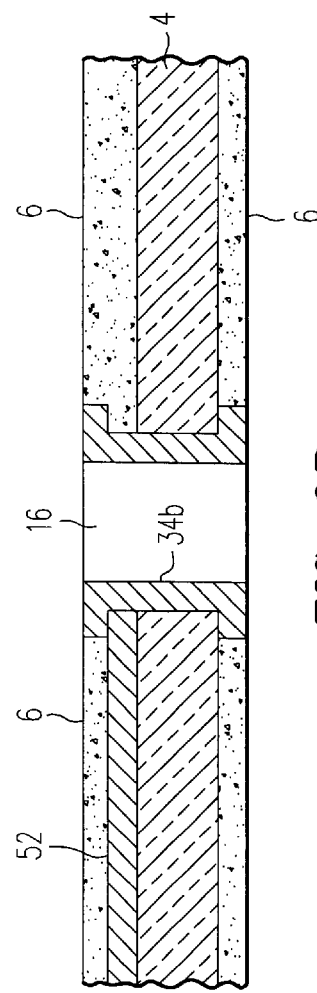

FIG. 4 is a bottom view showing another example of the circuit board for semiconductor package according to the second embodiment of the present invention. As illustrated, the circuit board shown in FIG. 4 is analogous to the example shown in FIG. 3 with the exception that the ground metal line 51 is disposed in the form of an approximately square band along all edges of the circuit board strip 100. This provides a larger contact area for the ground metal line 51 with the equipment as compared with the example of FIG. 3, thereby reducing a probability of accumulating the electrostatic charges on the circuit board or semiconductor chip.

Although this embodiment has been described in regard to the strip type circuit board for semiconductor package, the present invention can also be applied to a matrix type circuit board for semiconductor package in which a plurality of the chip mounting regions 8 are separated at a defined distance from one another and collectively arranged in rows and columns to constitute one sub strip, and a plurality of the sub strips are connected with a boundary of a slot having a defined length to constitute one main strip.

FIGS. 5A, 5B, 6A and 6B are bottom and cross-sectional views of a circuit board for semiconductor package in accordance with a third embodiment of the present invention.

Centering on resinous substrate 4, a chip mounting region 8 to place a semiconductor chip on is formed on the top surface of the resinous substrate 4, with a plurality of fine signaling, grounding or powering circuit patterns 10 radially arranged at the circumference of the chip mounting region 8 and extending to the edges of the chip mounting region 8. The circuit patterns 10 in the vicinity of the chip mounting region 8 have bond fingers (denoted by no reference numeral). And, the opposite underneath of the resinous substrate 4 is provided with a plurality of ball lands 14 (to be fused to conductive balls). The ball lands 14 on the bottom surface of the resinous substrate 4 are interconnected with the circuit patterns 10 formed on the top surface of the resinous substrate 4 through conductive via holes (not shown). The underneath of the resinous substrate 4 also has a plurality of circuit patterns 10, which are mostly grounding circuit patterns. The top and bottom surfaces of the resinous substrate 4 are coated with a cover coat 6 in a manner which leaves the bond fingers and ball lands 14 exposed and protect the circuit patterns 10 from the external environment, thereby forming a defined unit 2. A plurality of units 2 connected in series constitute a circuit board strip 100. A plurality of singulation holes 18 are formed at the circumference of the chip mounting region 8 of the individual unit 2 and used as a baseline in a subsequent singulation step of the semiconductor package. And, a plurality of index holes 16 for loading and holding the circuit board are disposed at the edges of the unit 2. This circuit board structure is the same as the previously described conventional structure.

As a subject matter of the present invention, a common pattern 52 connected to all circuit patterns 10 is formed along the edge of the individual unit 2 on either side of the circuit board, and destitute of any opening defined by the cover coat 6, which is the difference from the ground metal line 51 of the second embodiment. Namely, as illustrated, all the grounding circuit patterns 10 formed on the bottom surface of the circuit board may be connected to the common pattern 52. Although not shown in the figures, the common pattern 10 may also be formed on the top surface of the circuit board and connected to all signaling, grounding and powering circuit patterns 10.

Every unit 2 has the common pattern 52, which is connected to the common patterns 52 of the other units 2. Also, any one of the units 2 further comprises a grounding means connected to the common pattern 52, and the grounding means may be provided on either of the top or bottom surface of the circuit board or on both of them. It is well understood to those skilled in the art that the grounding means is open to the exterior through the cover coat 6 in order to facilitate grounding of the corresponding equipment.

The individual circuit board unit 2 may have singulation holes 18 used as a baseline in the subsequent step of singulating semiconductor packages. The common pattern 52 and the grounding means are formed outside the singulation holes 18, so that they are removed from the circuit board after the completion of the singulation step to electrically separate all signaling, grounding and powering circuit patterns 10, thereby preventing a short circuit.

The grounding means may be, as shown in FIGS. 5A and 5b, a conductive pad 34a having a defined thickness on the one side of any circuit board unit 2. The conductive pad 34a may have the area optionally changeable by any one skilled in the art and, as illustrated in the figures, may be formed in an approximately rectangular form on the one side of the plane circuit board unit 2. The thickness of the conductive pad 34a is, if not specifically limited, larger than that of the circuit patterns 10, i.e., the height of the cover coat 6 and may be equal to that of the circuit patterns 10 or smaller than the height of the cover coat 6, in which case there is no problem in regard to the contact with equipment. The conductive pad 34a can be formed from a conductive ink layer simply applied by a conductive ink dotting method.

The present invention makes it possible to provide the grounding means at a fixed position in every circuit board of a frame size irrespective of the type or size of the semiconductor packages to be manufactured and, if needed, forms a dummy region for electrical contact on the one end of the circuit board.

For more complete grounding with the grounding means, i.e., conductive pad 34a, the equipment may have a contact member such as conductive protrusions that can be brought in contact with the conductive pad 34a.

The grounding means may be formed in the index holes 16. Considering that the index holes 16 receive metallic fixed pins of the equipment when loading the circuit board in the equipment, a conductive coating layer 34b having a defined thickness is disposed on the inner wall of the index holes 16 so as to discharge the electrostatic charges to the equipment via the fixed pins. The coating layer 34b formed in the index holes 16 is of course connected to the common pattern 52.

It is well understood that this embodiment of the invention can be applied to a matrix type circuit board as well as a strip type circuit board.

Figure 7A:
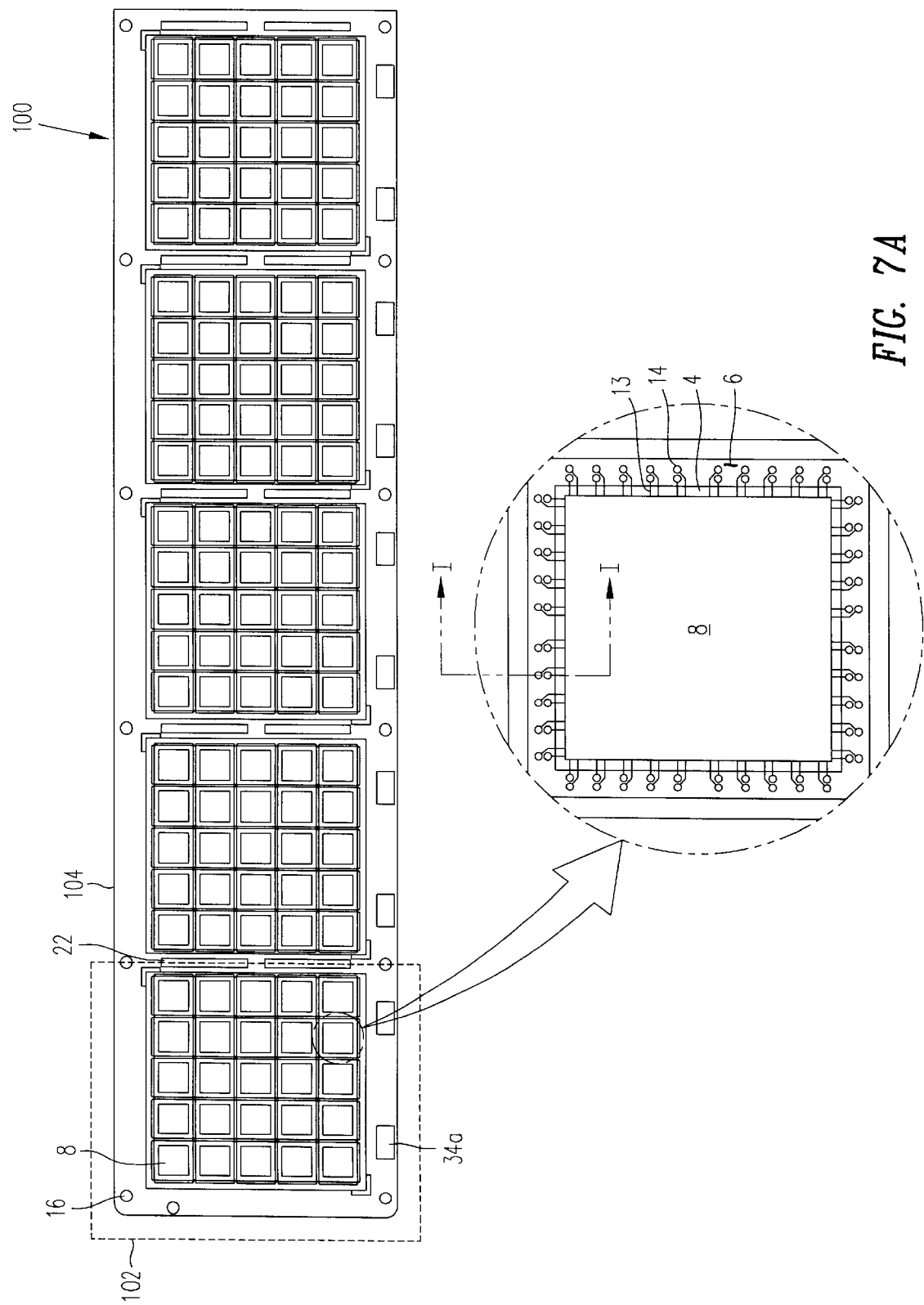
FIGS. 7A and 7B are plan views of a circuit board for semiconductor package in accordance with a fourth embodiment of the present invention.
Figure 7B:
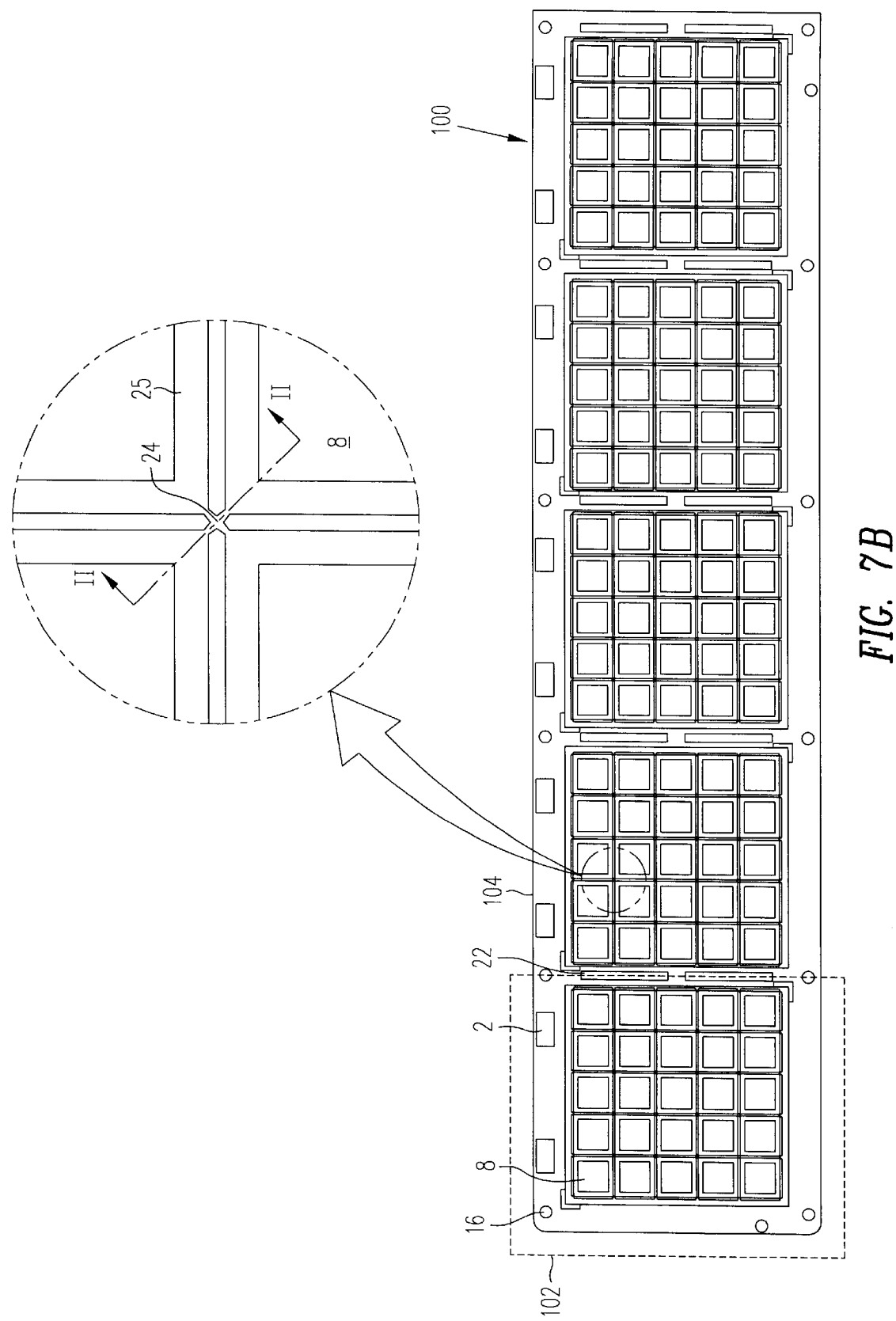

FIGS. 7A and 7B are plan views of opposing surfaces of a circuit board 100 for semiconductor package in accordance with a fourth embodiment of the present invention.

A plurality of square chip mounting regions 8 are formed on a resinous substrate 4. The chip mounting regions 8 are arranged in rows and columns into a matrix, with one such matrix constituting one sub strip 102. A plurality of the sub strips 102 are serially connected in a horizontal direction with a boundary of a vertical slot 22 having a defined length to constitute one main strip 104 of sub-strips 102. Slots 26 are formed through resinous substrate 4 around each chip mounting region 8 to facilitate singulation after encapsulation.

On a first surface of the resinous substrate 4 in the circumference of the chip mounting region 8 are formed a plurality of metal (e.g., gold or aluminum or copper) circuit patterns, each including a bond finger 13 and a ball land 14. The surface of the resinous substrate 4 and the circuit patterns are coated with a cover coat 6 consisting of a polymer resin, except that the bond fingers 13 and the ball lands 14 are exposed through the cover coat for connection of bond wires and solder balls thereto, respectively. The cover coat 6 not only protects the circuit patterns against the external environment but also secures the rigidity of the circuit board 100.

On an opposite second surface of the substrate shown in FIG. 7B (i.e., opposite the surface having the circuit patterns, a rectangular conductive ground ring 25 is provided on the resinous substrate 4 around the circumference of the chip mounting region 8. Ground ring 25 is electrically connected to at least one grounding conductive trace. Conductive connectors 24 electrically interconnect the ground rings 25 of adjacent circuit board units 101.

Figure 7C:
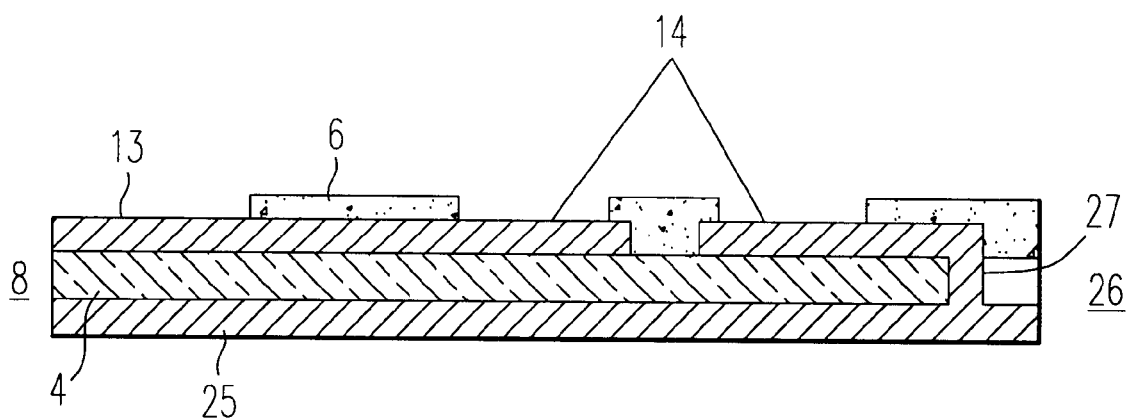
FIG. 7C is a cross sectional view along line I—I of FIG. 7A.
Figure 7D:
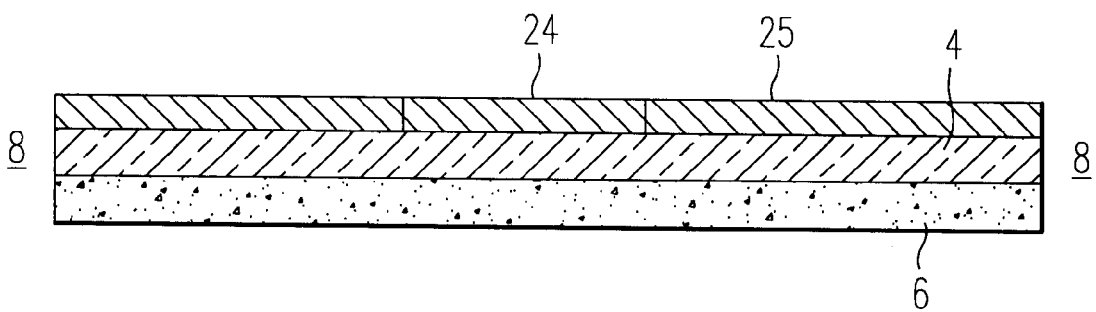
FIG. 7D is a cross-sectional view along line II—II of FIG. 7D.

Specifically, the ground ring 25 is formed on the side opposite to the side with the bond fingers 13 and the ball lands 14 thereon, and is electrically connected to those circuit patterns by a conductive via hole through resin layer 4, as shown in FIGS. 7B and 7C. Four ground ring rectilinear sections are arranged in a square to form one ground ring 25. Four intersecting ground ring rectilinear portions of adjacent ground rings 25 are interconnected with a plurality of conductive connectors 24 in an X form. FIG. 7D is a cross section through a connector 24. The plural ground rings 24 and X-shaped conductive connectors 24 enhance the rigidity of the circuit board 100 as well as the grounding of the semiconductor chip. Slots 26 are between adjacent ground ring rectilinear portions. The ground rings 25 are fixed on the surface of the resinous substrate 4 with an adhesive, though they may be applied otherwise. Whether to coat the ground rings 25 with the cover coat 6 is optional to those skilled in the art.

Conductive pad(s) 34 having a defined area are formed at the edge of the resinous substrate 4 located at an edge of the circuit board 100, and rendered open to the exterior by the cover coat 6. The conductive pad(s) 34a are electrically connected to the ground rings 25 which are electrically interconnected via the X-shaped conductive connectors 24. Unlike the ground rings 25, conductive pads 34a may be disposed on both sides of the resinous substrate 4 and formed from a conductive ink layer as in the third embodiment. The conductive pads 34a are brought in contact with the mold in the process of manufacturing semiconductor packages, especially, in the molding step, thereby allowing easy discharge of the electrostatic charges to the exterior.

Any material can be used for the conductive trace containing bond fingers 13 and ball lands 14, the ground rings 25, the conductive connectors 24 and the conductive pads 34a, so long as it exhibits conductivity. The material may be a copper (Cu) film.

In the figures, reference numeral 16 denotes an index hole for loading and holding the circuit board 100 in various equipments.

Figure 8A:
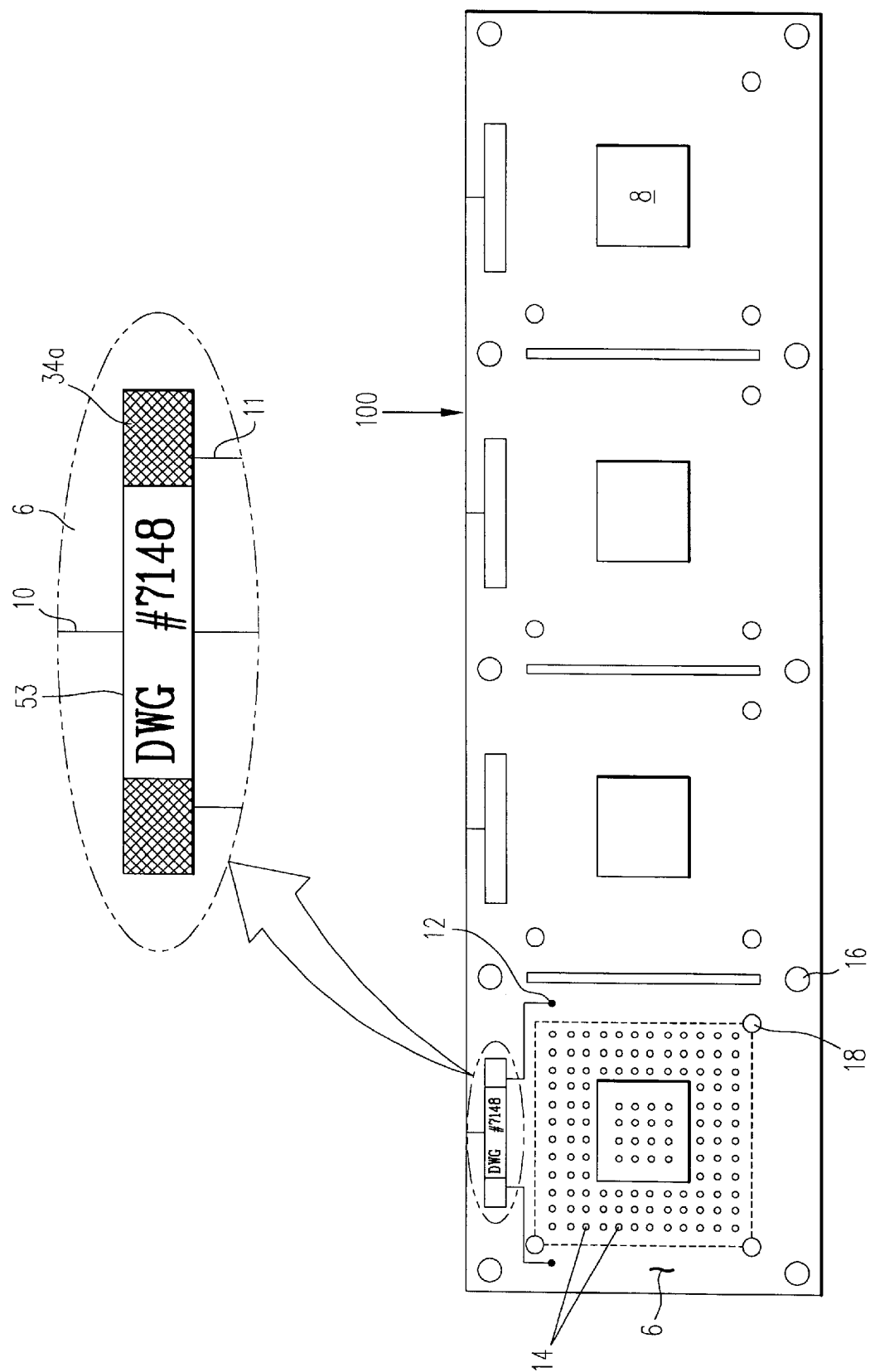
FIGS. 8A, 8B, 8C, and 8D are bottom views of a circuit board for semiconductor package in, accordance with a fifth embodiment of the present invention.
Figure 8B:
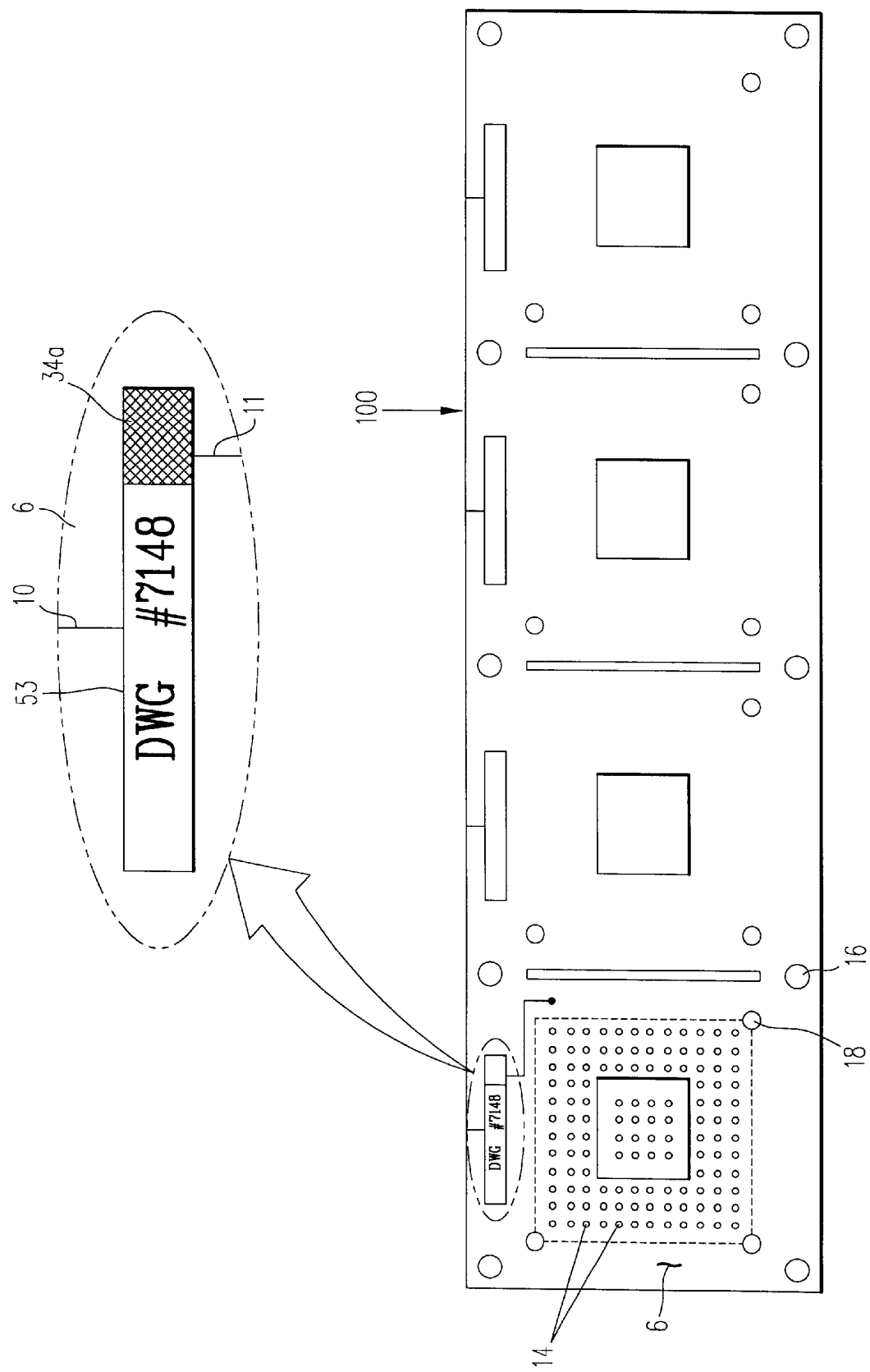

FIGS. 8A and 8B are bottom views of a circuit board 100 for semiconductor package in accordance with a fifth embodiment of the present invention, in which the top structure of the circuit board 100 is essentially analogous to those of the foregoing embodiments and its detailed description will be avoided.

The static-electricity removing circuit board 100 for semiconductor package according to the fifth embodiment of the present invention as shown in FIG. 8A comprises: a resinous substrate 4; a plurality of circuit patterns 10 including at least one grounding circuit pattern 11 to constitute a defined circuit pattern on top and bottom surfaces of the resinous substrate 4; a semiconductor chip mounting region 8 disposed at the center of the top surface of the resinous substrate where no circuit pattern 10 exists; a plurality of conductive via holes 12 including at least one grounding via hole electrically connecting the circuit patterns on the top and bottom surfaces of the resinous substrate 4; a cover coat 6 coated in end portions of the plural circuit patterns 10 adjacent to the semiconductor chip mounting region 8 formed on the top surface of the resinous substrate 4 and part of the plural circuit patterns 10 formed on the bottom surface of the resinous substrate 4 other than the ball lands 14 to be fused to the balls of the circuit patterns 10, thereby insulating and protecting the circuit patterns 10; a plurality of singulation holes 18 and index holes 16 formed on the outside of the circuit patterns 10; and a circuit board labeling region 53 on either side having conductive pads 34a and being open to the exterior through the cover coat 6 and electrically connected to the conductive pad region 34a, the grounding via hole 12 and the grounding circuit pattern 11, thereby displaying characters or symbols.

That is, the fifth embodiment of the invention is distinct from the foregoing embodiments in that it includes the circuit board labeling region 53 as a electrostatic charge remover marked in a character or symbol. The labeling region 53 normally contains important information about the manufacturer and the customer and is marked for customer name, SID number, DWG number and vendor code in a character or symbol.

The circuit board labeling region 53 used as a electrostatic charge remover in FIG. 8A has the conductive pads 34a electrically connected to the grounding via hole 12 through the grounding circuit pattern 11, so that the conductive pads 34a of the labeling region 53 is brought in direct contact with the mold in the manufacture of semiconductor packages, especially, in the molding step, thereby discharging the electrostatic charges.

Though not illustrated in the figures, a gold gate 40 connected to a ground signal is connected to the circuit board labeling region 53, and a ground ring (denoted by no reference numeral) connected to a ground bond pad (denoted by no reference numeral) of the semiconductor chip via a wire is connected to a gold gate 17 by the grounding circuit pattern 11. This construction makes it possible to provide the circuit board 100 of the present invention simply with a modification of the conventional printed circuit board.

The circuit board labeling region 53 of the present invention may be formed in either of top or bottom surface of the circuit board 100, or in the bottom surface of the circuit board 100 on the side of the gold gate 40 on the top surface of the circuit board. The grounding effect depends on the position of the labeling region 53 in the circuit board 100 of the present invention as follows: (1) with the labeling region 53 on the top surface of the printed circuit board 100, the circumference of the circuit board 100 is pressed down in the molding step, bringing the upper mold (denoted by no reference numeral) in contact with the conductive pads 34a; (2) with the labeling region 53 on the bottom surface of the circuit board 100, the circumference of the circuit board 100 is pressed down in the molding step, grounding the lower mold (denoted by no reference numeral) in contact with the conductive pads 34a; and (3) with the labeling region 53 on the bottom surface of the circuit board 100 on the side of the gold gate 40, the mold presses the gate 40 and the conductive pads 34a underlying the gate 40.

Figure 8C:
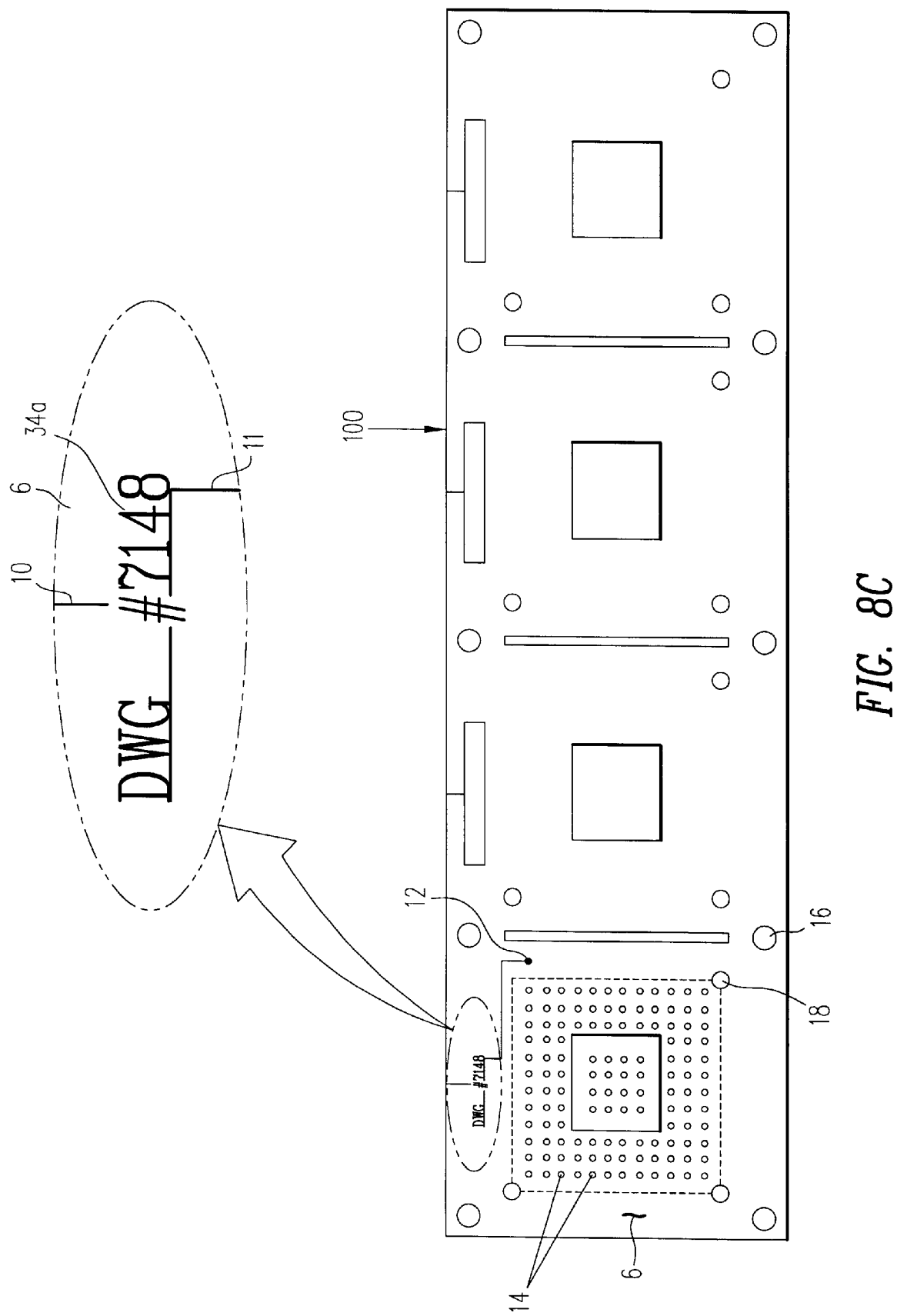
Figure 8D:
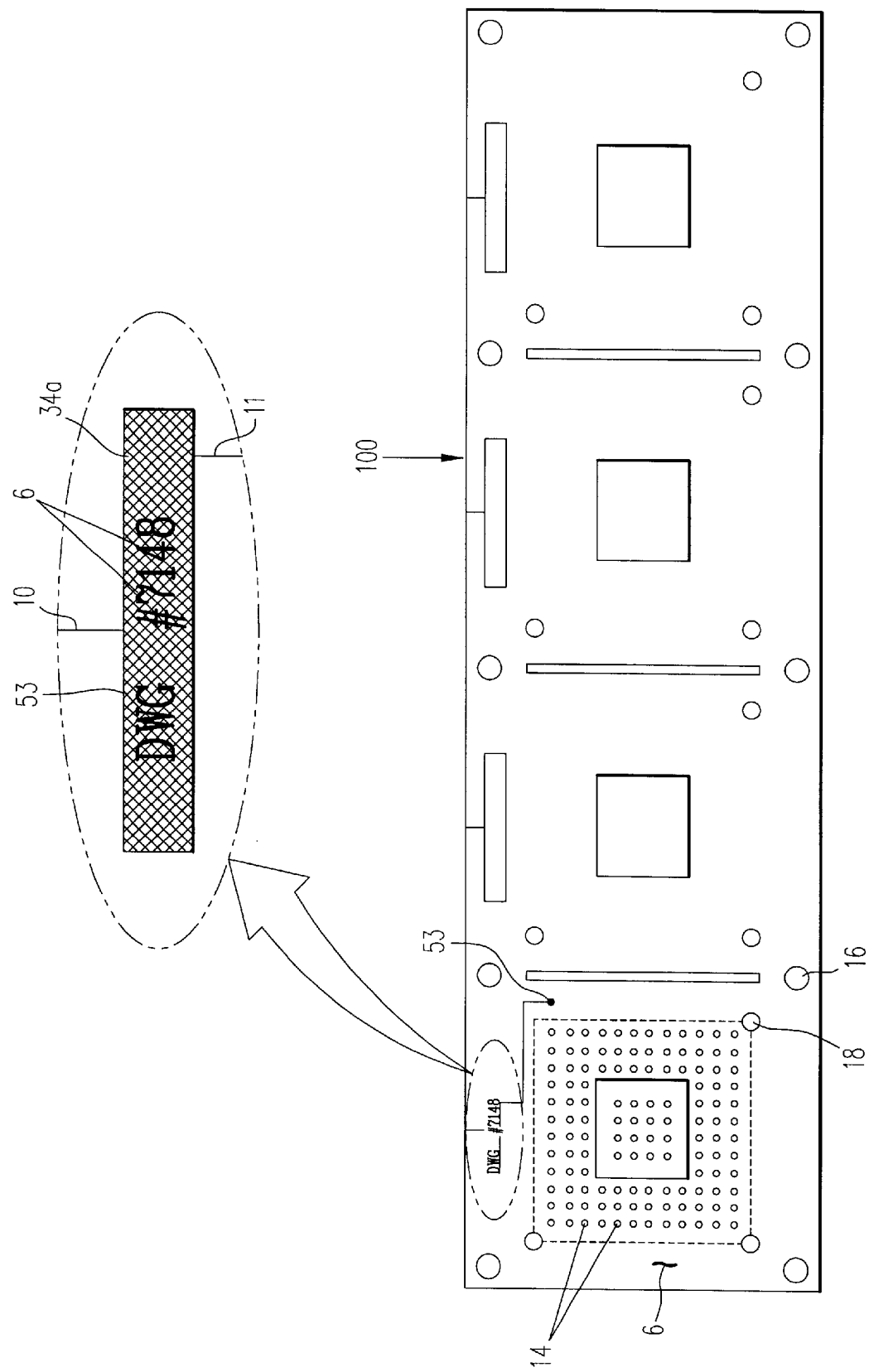

FIGS. 8B, 8C and 8D are bottom views of another examples of the circuit board according to the fifth embodiment of the present invention. These examples are analogous to that of FIG. 8A, with the exceptions that the conductive pads 34a is formed on either side of the printed circuit board labeling region 53 (in FIG. 8B), that the conductive pads 34a form the character or symbol of the labeling region 53 with the cover coat 6 plated with gold (Au) (in FIG. 8C), and that the conductive pads 34a form the entire part of the labeling region 53 other than the character or symbol, with the cover coat 6 plated with gold (Au) (in FIG. 8D).

The circuit board labeling region 53 is cut off in the singulation step to yield semiconductor packages. It is to be noted that the grounding structure with the conductive pads 34a formed on the labeling region 53 does not affect the semiconductor package after the completion of the manufacture.

As well understood in this embodiment, the present invention can be applied to the matrix type circuit board as well as the strip type circuit board.

As described above, in the circuit board for semiconductor package according to the present invention, the electrostatic charge remover connecting the circuit patterns to the edge of the circuit board includes an opening region, a ground metal line and a common pattern coated by the cover coat, thereby allowing the circuit board perfectly grounded to the corresponding equipment in the manufacture of the semiconductor package and immediately dissipating the electrostatic charges. This effectively prevents a breakdown of principal components of the semiconductor package such as semiconductor chip, bonding wire, conductive race, etc. caused by abrupt discharge of the accumulated electrostatic charges.

It is to be noted that like reference numerals denote the same components in the drawings, and a detailed description of generally known function and structure of the present invention will be avoided lest it should obscure the subject matter of the present invention.

What is claimed is:

1. A printed circuit board for a semiconductor package comprising:
    a resinous substrate having a top surface and an opposite bottom surface; a chip mounting region formed on the top surface of the resinous substrate for mounting semiconductor chip thereon;
    a plurality of fine circuit patterns radially disposed in the circumference of the chip mounting region and extending to the edge of the chip mounting region;
    a plurality of ball lands formed in an array on the bottom surface of the resinous substrate;
    a conductive via hole through the substrate electrically connected between the circuit patterns on the top surface of the resinous substrate and the ball lands on the bottom surface of the resinous substrate;
    a cover coat applied to the top and bottom surfaces of the resinous substrate through which the ball lands are open to the exterior; and
    a means for removing electrostatic charges provided at the edge of the substrate and electrically connected to the plural circuit patterns, said means adapted to remove electrostatic charges in the manufacture of semiconductors.

2. The printed circuit board as claimed in claim 1, wherein a plurality of the circuit boards are connected in series with a slot interposed therebetween to constitute a strip.

3. The printed circuit board as claimed in claim 2, wherein the electrostatic charge removing means includes an opening region not coated with the cover coat so as to expose the circuit patterns to the exterior in the vicinity of the edge of the circuit board.

4. The printed circuit board as claimed in claim 2, wherein the electrostatic charge removing means includes a ground metal line having a defined width formed along at least one edge of the circuit board with the ball lands formed thereon and adapted to be in contact with corresponding equipment in a manufacture of the semiconductor package.

5. The printed circuit board as claimed in claim 2, wherein the electrostatic charge removing means includes a common pattern formed along the edge of the individual units on either side of the circuit board, the common patterns of the individual units being interconnected, one of the plural units having a grounding means connected to the common pattern, the grounding means being open by the cover coat.

6. The printed circuit board as claimed in claim 5, wherein the common pattern and the grounding means are formed on both sides of the resinous substrate.

7. The printed circuit board as claimed in claim 5, wherein the resinous substrate has a plurality of singulation holes in the circumference of the chip mounting region, the resinous substrate having a common pattern and a grounding means outside the singulation holes, the singulation holes being adapted for use as baseline in a singulation step during the making of the semiconductor package.

8. The printed circuit board as claimed in claim 5, wherein the grounding means includes a conductive pad formed on either side of the resinous substrate.

9. The printed circuit board as claimed in claim 8, wherein the conductive pad includes a conductive ink layer.

10. The printed circuit board as claimed in claim 5, wherein a plurality of index holes are formed at the edges of the individual units of the circuit board, and a grounding means is formed in the index holes of one of the units.

11. The printed circuit board as claimed in claim 10, wherein the grounding means includes a metal coating layer formed on an inner wall of the index holes.

12. The printed circuit board as claimed in claim 2, wherein the electrostatic charge removing means includes a printed circuit board labeling region having a conductive pad, the printed circuit board labeling region being marked in a character or symbol.

13. The printed circuit board as claimed in claim 1, wherein a plurality of the chip mounting regions are separated at a defined distance from one another and collectively arranged in rows and columns to constitute one sub strip, wherein a plurality of the sub strips are connected with a boundary of a slot having a defined length to constitute one main strips.

14. The printed circuit board as claimed in claim 13, wherein the electrostatic charge removing means includes an opening region not coated with the cover coat so as to expose the circuit patterns to the exterior in the vicinity of the edge of the circuit board.

15. The printed circuit board as claimed in claim 13, wherein the electrostatic charge removing means includes a ground metal line having a defined width formed along at least one edge of the circuit board with the ball lands formed thereon and adapted to be in contact with the corresponding equipment in a manufacture of the semiconductor package.

16. The printed circuit board as claimed in claim 13, further comprising:
    a plurality of ground rings formed in the circumference of the plural chip mounting regions on the bottom surface of the resinous substrate of the individual sub strip;
    a means for electrically connecting one ground ring to the adjacent ground rings; and of the resinous substrate, and adapted to prevent accumulation of electrostatic charges during manufacture of the semiconductor package.

17. The printed circuit board as claimed in claim 16, wherein the connecting means interconnects the adjacent ground rings in the form of an X, with four ground rings arranged at four corners of one centering ground ring.

18. The printed circuit board as claimed in claim 16, wherein the conductive pad includes a conductive ink layer.

19. The printed circuit board as claimed in claim 13, wherein the electrostatic charge removing means includes a printed circuit board labeling region having a conductive pad, the printed circuit board labeling region being marked in a character or symbol.

20. The printed circuit board as claimed in claim 1, wherein the electrostatic charge removing means includes an opening region not coated with the cover coat so as to expose the circuit patterns to the exterior in the vicinity of the edge of the circuit board.

21. The printed circuit board as claimed in claim 20, wherein a plurality of the opening regions are provided in a rectangular form at the edge of the circuit board and in the vicinity of the slot.

22. The printed circuit board as claimed in claim 20, wherein a plurality of the opening regions are provided in the form of an integrated square band along the edge of the circuit board and the vicinity of the slot.

23. The printed circuit board as claimed in claim 1, wherein the electrostatic charge removing means includes a ground metal line having a defined width formed along at least one edge of the circuit board with the ball lands formed thereon and adapted to be in contact with corresponding equipment in a manufacture of the semiconductor package.

24. The printed circuit board as claimed in claim 23, wherein the ground metal line is formed along parallel edges of the circuit board.

25. The printed circuit board as claimed in claim 23, wherein the edges of the circuit board have a plurality of index holes having a defined diameter, the index holes being metal plated and in connection with a grounding line among the circuit patterns, the index holes being disposed in the ground metal line and electrically interconnected.

26. The printed circuit board as claimed in claim 1, wherein the electrostatic charge removing means includes a printed circuit board labeling region having a conductive pad, the printed circuit board labeling region being marked in a character or symbol.

27. The printed circuit board as claimed in claim 26, wherein the conductive pad is formed on either side or both sides of the printed circuit board labeling region.

28. The printed circuit board as claimed in claim 26, wherein the character or symbol is the conductive pad.

29. The printed circuit board as claimed in claim 26, wherein the entire part of the printed circuit board labeling region other than the character or symbol is the conductive pad.

30. The printed circuit board as claimed in claim 26, wherein a gold gate formed from a conductive metal and connected to the ground is formed at one corner of the top surface of the resinous substrate, the gold gate being electrically connected to the conductive pad of the printed circuit board labeling region via a ground via hole and/or a ground circuit pattern.

31. The printed circuit board as claimed in claim 30, wherein the printed circuit board labeling region is formed on the bottom surface of the circuit board on the side of the gold gate.

32. A printed circuit board for making a semiconductor package comprising:
a resinous substrate comprising a region for disposing a semiconductor chip and a plurality of fine circuit patterns disposed adjacent the region, each of said plural circuit extending to an outer edge of the substrate; and
a cover coat applied on the substrate over the circuit patterns, said cover coat having at least one opening through which the plural circuit patterns are exposed at the outer edge of the substrate.

33. The printed circuit board as claimed in claim 32, wherein the substrate has a plurality of the outer edges, and a plurality of discrete ones of the openings are provided in the cover coat, with each opening exposing a plurality of the circuit patterns at a respective outer edge of the substrate.

34. The printed circuit board as claimed in claim 32, wherein the opening in the cover coat has the form of a ring around the substrate.

35. A printed circuit board for making a semiconductor package comprising:
a resinous substrate comprising a region for disposing a semiconductor chip and a plurality of fine circuit patterns disposed adjacent the region, each of said plural circuit patterns extending toward an outer edge of the substrate;
a cover coat applied on the substrate over the circuit patterns; and
a ground metal line having a defined width formed along at least one outer edge of the substrate, said ground metal line being electrically connected to the plural circuit patterns, said ground metal line being exposed through the cover coat and adapted to be grounded by equipment used during manufacture of the semiconductor package.

36. The printed circuit board as claimed in claim 35, wherein the substrate includes a plurality of said regions in an array, with each region having an associated set of the plural circuit patterns that are electrically connected to the ground metal line.

37. The printed circuit board as claimed in claim 36, wherein the ground metal line is formed along parallel outer edges of the substrate.

38. The printed circuit board as claimed in claim 36, the substrate includes a plurality of index holes through the substrate and the ground metal line, said index holes each having a metal lining that is electrically connected to the ground metal line.

39. A strip of printed circuit boards each for making a semiconductor package comprising:
a resinous substrate comprising a plurality of circuit board units each for assembly of a semiconductor package, each circuit board unit including a plurality of circuit patterns extending to an outer edge of the substrate; and
a cover coat applied on the substrate over the circuit patterns;
a common circuit pattern formed along at least one outer edge of the substrate and electrically connected to the plural circuit patterns of each of the circuit board units, said common circuit pattern being covered by the cover coat; and
a grounding means exposed through the cover coat for grounding against equipment used during manufacture of the semiconductor packages, said grounding means being on the substrate and electrically connected to the common circuit pattern.

40. The printed circuit board as claimed in claim 39, wherein the substrate has opposed top and bottom surfaces, and the grounding means is on both of the top and bottom surfaces of the resinous substrate.

41. The printed circuit board as claimed in claim 39, wherein the grounding means is a conductive region disposed at an end of the strip.

42. The printed circuit board as claimed in claim 39, wherein a plurality of index holes are formed through the substrate at the edges of the individual circuit board units, said grounding means being formed in at least one of the index holes of the strip.

43. A printed circuit board for making semiconductor packages comprising:
a resinous substrate having a top surface, an opposite bottom surface, and rows and columns of circuit board units each for making one of the semiconductor packages,
wherein each circuit board unit includes a central aperture through the substrate for disposing a semiconductor chip therein and four outer corners defined by slots between adjacent ones of the circuit board units, with adjacent circuit board units joined at the corners thereof, wherein each said circuit board unit comprises a plurality of fine circuit patterns disposed around the aperture on the top surface of the substrate, an electrically conductive ring around the aperture on the bottom surface in the substrate, and at least one electrically conductive via through the substrate electrically connected between at least one of the circuit patterns and the ground ring, and wherein the ground rings of adjacent circuit board units are electrically connected; and a means disposed adjacent an outer edge of the resinous substrate and electrically connected to all of the ground rings of the circuit board units for grounding against equipment used during manufacture of the semiconductor packages.

44. The printed circuit board as claimed in claim 43, wherein four of the adjacent circuit board units are electrically connected at the corners thereof by a metal cross shaped structure.

* * * * *